United States Patent
Cho et al.

(10) Patent No.: US 9,764,320 B2
(45) Date of Patent: Sep. 19, 2017

(54) ANION EXCHANGE METHODS USING ANION EXCHANGE PRECURSOR

(71) Applicants: SAMSUNG ELECTRONICS CO., LTD., Suwon-si (KR); AJOU UNIVERSITY INDUSTRY-ACADEMIC COOPERATION FOUNDATION, Suwon-si (KR)

(72) Inventors: Kyungsang Cho, Gwacheon-si (KR); Sangwook Kim, Suwon-si (KR); Donghyeok Choi, Suwon-si (KR)

(73) Assignees: SAMSUNG ELECTRONICS CO., LTD., Suwon-si (KR); AJOU UNIVERSITY INDUSTRY-ACADEMIC COOPERATION FOUNDATION, Suwon-si (KR)

( * ) Notice: Subject to any disclaimer, the term of this patent is extended or adjusted under 35 U.S.C. 154(b) by 117 days.

(21) Appl. No.: 14/802,696

(22) Filed: Jul. 17, 2015

(65) Prior Publication Data
US 2016/0016160 A1    Jan. 21, 2016

(30) Foreign Application Priority Data
Jul. 18, 2014 (KR) .................. 10-2014-0091312

(51) Int. Cl.
*B01J 41/02* (2006.01)
*H01L 21/02* (2006.01)
*B01J 41/10* (2006.01)

(52) U.S. Cl.
CPC ............... *B01J 41/02* (2013.01); *B01J 41/10* (2013.01); *H01L 21/02601* (2013.01)

(58) Field of Classification Search
CPC ....... B01J 41/02; B01J 41/10; C09K 11/0805; C09K 11/0811; C09K 11/0816; C09K 11/0838; C09K 11/0844; C09K 11/0883; C09K 11/0894; C09K 11/56; C09K 11/562; C09K 11/565; C09K 11/567;
(Continued)

(56) References Cited

U.S. PATENT DOCUMENTS

2013/0175220 A1    7/2013 Hristovski et al.

FOREIGN PATENT DOCUMENTS

| KR | 1020110105651 A | 9/2011 |
| KR | 101415729 B1 | 7/2014 |

OTHER PUBLICATIONS

Bonneau. Low-Temperature Precursor Synthesis of Crystalline Nickel Disulfide. Inorg. Chem. 1990, 29, 2511-2514.*
(Continued)

*Primary Examiner* — Matthew E Hoban
(74) *Attorney, Agent, or Firm* — Sughrue Mion, PLLC

(57) ABSTRACT

An anion exchange method using an anion exchange precursor based on a metal-chalcogenide compound is provided. The anion exchange method includes exchanging an anionic element of a nanoparticle with an element X of an anion exchange precursor represented by $Na_2X_n$ via a reaction between the anion exchange precursor and the nanoparticle in the presence of a reaction medium, wherein X is at least one element selected from the group consisting of Se, S, and Te, and n is an integer from 2 to 10.

9 Claims, 3 Drawing Sheets

(58) Field of Classification Search
CPC ....... C09K 11/59; C09K 11/62; C09K 11/621; C09K 11/623; C09K 11/625; C09K 11/626; C09K 11/628; C09K 11/64; C09K 11/66
See application file for complete search history.

(56) References Cited

OTHER PUBLICATIONS

G. D. Moon et al., "Chemical transformations of nanostructured materials", Nano Today (2011) 6, pp. 186-203, URL: www.elsevier.com/locate/nanotoday.

Jungwon Park et al., "Hetero-Epitaxial Anion Exchange Yields Single-Crystalline Hollow Nanoparticles", Lawrence Berkeley National Laboratory, Apr. 1, 2010, Total 18 pages, URL: http://www.escholarship.orq/uc/item/9203n56m.

Jungwon Park et al., "Hetero-Epitaxial Anion Exchange Yields Single-Crystalline Hollow Nanoparticles", Journal of the American Chemical Society, Sep. 9, 2009, vol. 131, No. 39, pp. 13943-13945.

Forest T. Quinlan et al., "Reverse Micelle Synthesis and Characterization of ZnSe Nanoparticles", Langmuir 2000, vol. 16, No. 8, American Chemical Society, Mar. 15, 2000, pp. 4049-4051.

Pantelis N. Trikalitis et al., "Single-Crystal Mesostructured Semiconductors with Cubic Ia3d Symmetry and Ion-Exchange Properties", J. American Chemical Society, 2002, vol. 124, No. 41, JACS Articles Sep. 24, 2002, pp. 12255-12260.

D. H. Son et al., "Cation Exchange Reactions in Ionic Nanocrystals", Science vol. 306, 1009, Nov. 5, 2004, pp. 1009-1012, URL: www.sciencemag.org.

Jiatao Zhang et al., "Nonepitaxial Growth of Hybrid Core-Shell Nanostructures with Large Lattice Mismatches", Science vol. 327, Mar. 26, 2010, pp. 1634-1638, URL: www.sciencemag.org.

\* cited by examiner

ANION EXCHANGE METHODS USING ANION EXCHANGE PRECURSOR

RELATED APPLICATION

This application claims the benefit to Korean Patent Application No. 10-2014-0091312, filed Jul. 18, 2014 in the Korean Intellectual Property Office, the disclosure of which is incorporated by reference herein in its entirety.

BACKGROUND

1. Field

Exemplary embodiments relate to an ion exchange precursor, and more particularly, to an anion exchange precursor and anion exchange methods using an anion exchange precursor.

2. Description of the Related Art

The Alivisatos group reported Cation Exchange Reactions in Ionic Nanocrystals in Science in 2004 (see Dong Hee Son, et al., "Cation Exchange Reactions in Ionic Nanocrystals," Science, 2004 (306) 1009)). Since then, diverse research has been vigorously conducted into cation exchange reactions and cation exchange precursors causing cation exchange reactions (see JACS 2009 (131) 13943; Jiatao Zhang, et al., "Nonepitaxial Growth of Hybrid Core-Shell Nanostructures with Large Lattice Mismatches," Science 2010 (327) 1634-1638)). For example, although core-shell nanoparticles having an Au-core and an AgS-shell are relatively easy to manufacture, it is difficult to manufacture core-shell nanoparticles having an Au-core and a CdS-shell. This is because of the mismatch between the lattice structures of the Au-core and the lattice structure of the CdS-shell, which causes lattice strain at the interface between the core and the shell. However, starting from core-shell nanoparticles including an Au-core and an AgS-shell, silver (Ag) atoms from the AgS-shell may be exchanged with cadmium (Cd) atoms, and thus nanoparticles including an Au-core and a CdS-shell may be obtained. In this respect, the process of exchanging cationic Ag with cationic Cd is an example of a cation exchange reaction. However, anion exchange reactions and precursors for anion exchange reactions have not been developed.

SUMMARY

Exemplary embodiments provide anion exchange methods using an anion exchange precursor based on a metal-chalcogenide compound.

According to an aspect of an exemplary embodiment, there is provided an anion exchange method including exchanging an anionic element of a nanoparticle with an element X of an anion exchange precursor represented by $Na_2X_n$ via a reaction between the anion exchange precursor and the nanoparticle in the presence of a reaction medium, wherein X is at least one element selected from the group consisting of Se, S, and Te, and n is an integer from 2 to 10.

According to an aspect of another exemplary embodiment, there is provided a method of preparing a nanoparticle, the method including exchanging an anionic element of a nanoparticle with an element X of an anion exchange precursor represented by $Na_2X_n$ via a reaction between the anion exchange precursor and the nanoparticle in the presence of a reaction medium, wherein X is at least one element selected from the group consisting of Se, S, and Te, and n is an integer from 2 to 10.

BRIEF DESCRIPTION OF THE DRAWINGS

The above and/or other aspects will become apparent and more readily appreciated from the following description of exemplary embodiments, taken in conjunction with the accompanying drawings in which.

DETAILED DESCRIPTION

Figure 1:
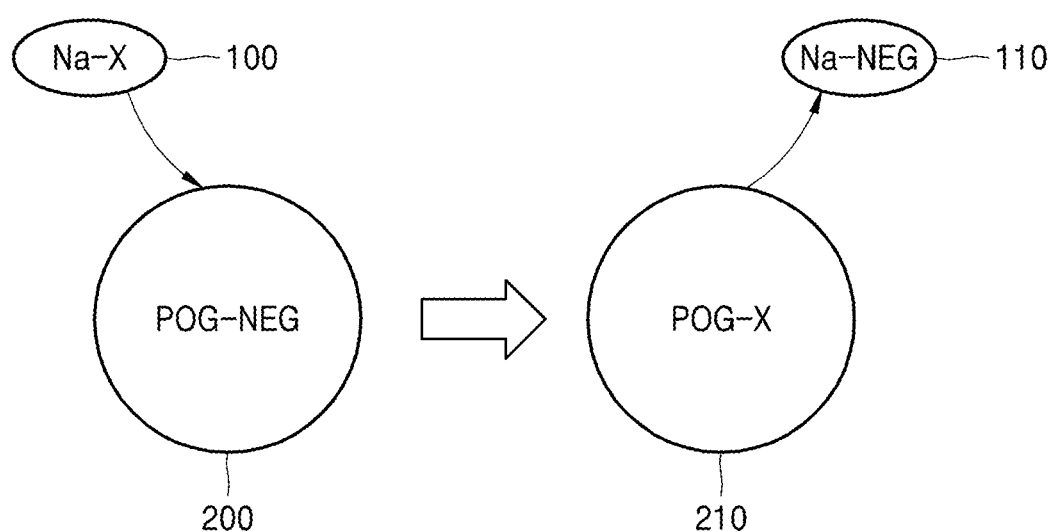
FIG. 1 is a schematic diagram illustrating an anion exchange method according to an exemplary embodiment.

Exemplary embodiments will now be described in detail with reference to the accompanying drawings, wherein like reference numerals refer to like elements throughout. In this regard, the present exemplary embodiments may have different forms and should not be construed as being limited to the descriptions set forth herein. Accordingly, the exemplary embodiments herein are merely described below by referring to the figures in order to explain aspects of the present description. Expressions such as "at least one of," when preceding a list of elements, modify the entire list of elements and do not modify the individual elements of the list.

Hereinafter, an anion exchange method according to an exemplary embodiment will be described in detail with reference to FIG. 1. FIG. 1 is a schematic diagram illustrating an anion exchange method according to the illustrated exemplary embodiment. The anion exchange method according to the illustrated exemplary embodiment includes exchanging an anionic element of a nanoparticle with an element X of an anion exchange precursor represented by the formula $Na_2X_n$, where X is at least one element selected from the group consisting of Se, S, and Te, and n is an integer from 2 to 10 via a reaction between the anion exchange precursor with the nanoparticle in the presence of a reaction medium. Referring to FIG. 1, an anion exchange precursor 100 may have a composition of Na—X, and a nanoparticle 200 may have a composition of POG-NEG. In this regard, "POG" refers to a cationic element of nanoparticle 200. "NEG" refers to an anionic element of nanoparticle 200. When the anion exchange precursor 100 is subjected to a reaction with the nanoparticle 200, the anionic element NEG of the nanoparticle 200 is exchanged with the anionic element X of the anion exchange precursor 100. Accordingly, while the nanoparticle 200 has the composition of POG-NEG before the reaction, a nanoparticle 210 has a composition of POG-X after the reaction. Thus, the anion exchange precursor 100 may be converted into a material 110 having a composition of Na-NEG. Through this process, a nanoparticle 210 having a desired composition of POG-X may be obtained by exchanging the anionic element NEG of the nanoparticle 200 with the desired anionic element X. The anion exchange reaction occurs on the surface of the nanoparticle 200, or on the surface of and inside the nanoparticle 200. Thus, the surface of the nanoparticle 210 or the surface and inside of the nanoparticle 210 may have the desired composition of POG-X.

The anion exchange precursor 100 includes compounds represented by the formula $Na_2X_n$, where X includes at least one element selected from the group consisting of Se, S and Te, and n is an integer from 2 to 10. According to the illustrated exemplary embodiment, a compound represented by $Na_2X_n$ serves as an agent efficiently exchanging the anionic element NEG of the nanoparticle with the anionic element X. As n decreases to a value that is too low, e.g., when n is 1, it is difficult to obtain anion exchange capability. As n increases to a value that is too high, it is difficult to prepare a compound represented by the formula $Na_2X_n$ and excess X may remain as an impurity. Typically, n is an integer from 2 to 10. For example, n may be an integer from 2 to 5. As an additional example, n may be an integer from 2 to 3.

As an example, the compound represented by $Na_2X_n$ may be obtained via a reaction between Na or $NaBH_4$ with a chalcogen element X such as Se, S, or Te in the presence of a reaction medium such as methanol, ethanol, or dimethyl ether (DME).

More particularly, $Na_2Se_2$ may be generated by the following reaction.

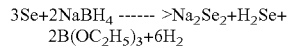

$$3Se + 2NaBH_4 \longrightarrow Na_2Se_2 + H_2Se + 2B(OC_2H_5)_3 + 6H_2$$

As another example, $Na_2S_n$ may also be generated by the following reaction.

$$2Na + nS \longrightarrow Na_2Sn\ (2 \leq n \leq 10)$$

The nanoparticle 200 may be any nanoparticle including the anionic element NEG. The nanoparticle 200 may or may not include the chalcogen element X, which may be Se, S, or Te.

For example, the nanoparticle 200 may be a quantum dot, a metal nanocrystal (NC), a magnetic NC, an oxide NC, a nanowire, or a nanoplate. Examples of the quantum dot may include CdS, CdSe, CdTe, ZnS, ZnSe, ZnTe, ZnO, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, CdHgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe, Si, Ge, SiC, SiGe, or any combination thereof. As an example, the quantum dot may have a core-shell structure or a core-shell-shell structure. The nanoparticle may have a diameter of from about 1 nm to about 100 nm.

The nanoparticle 200 may be used in an amount of about 100 parts by weight to about 10,000,000 parts by weight based on 100 parts by weight of the anion exchange precursor 100. As the amount of the nanoparticle 200 decreases to an amount too low, anion exchange reactions may occur as a result of excess amounts of anion exchange precursor 100. As the amount of the nanoparticles 200 increases to an amount too high, anion exchange reactions may not efficiently occur.

The reaction medium may be any solvent capable of dissolving or dispersing the anion exchange precursor 100 and the nanoparticle 200. Examples of the reaction medium may include water, an organic solvent, or any combinations thereof. Examples of the organic solvent may include methanol, ethanol, dimethyl ether, dimethylformamide (DMF), dimethylsulfoxide (DMSO), ethanolamine, formamide, hydrazine hydrate, acetonitrile, or any combinations thereof.

According to another exemplary embodiment, the reaction medium may include at least one polar solvent. In this exemplary embodiment, reaction between the anion exchange precursor 100 and the nanoparticle 200 may progress more efficiently and more quickly. In particular, since the solubility of the anion exchange precursor increases in a polar solvent, the polar solvent may be used as an efficient reaction medium. Examples of the polar solvent may include water, dimethylformamide (DMF), dimethylsulfoxide (DMSO), ethanolamine, formamide, hydrazine hydrate, acetonitrile, or any combinations thereof.

The reaction medium may be used in an amount of from about 10,000 parts by weight to about 10,000,000,000 parts by weight based on 100 parts by weight of the anion exchange precursor 100. As the amount of the reaction medium decreases, the anion exchange precursor 100 may not be sufficiently dissolved. On the other hand, as the amount of the reaction medium increases, concentrations of reactants decrease, thereby inhibiting efficient anion exchange reactions.

In the anion exchange method according to the illustrated exemplary embodiment, the anion exchange reaction occurs very quickly, and for example, takes a short amount of time, namely about several seconds. In addition, in the anion exchange method according to the illustrated exemplary embodiment, the anion exchange reaction may not substantially change the shape or crystal characteristics of the nanoparticle.

In the anion exchange method according to the illustrated exemplary embodiment, the temperature in which the anion exchange reaction is conducted may be in a range of from about 20° C. to about 120° C. However, according to another exemplary embodiment, the temperature in which the anion exchange reaction is conducted may be greater than or less than the temperature range described above.

According to another exemplary embodiment, a method of preparing a nanoparticle is provided. The method includes preparing a second nanoparticle by exchanging an anionic element from a first nanoparticle with an element X from an anion exchange precursor represented by $Na_2X_n$, where X is at least one element selected from the group consisting of Se, S, and Te, and n is an integer from 2 to 10, via a reaction between the anion exchange precursor and the first nanoparticle in the presence of a reaction medium.

EXAMPLES

Preparation Example 1

Synthesis of $Na_2Se_2$ 1 g of Se (Sigma-Aldrich) was reacted with 1 g of $NaBH_4$ (Sigma-Aldrich) in the presence of 10 ml of ethanol at 0° C. for 1.5 hours in a nitrogen atmosphere while refluxing. Then, the resultant was centrifuged, washed with ethanol, and dried to obtain 1.2 g of $Na_2Se_2$ in a purple solid powder form.

Preparation Example 2

Synthesis of $Na_2S_2$ 0.032 g of S (Sigma-Aldrich) was reacted with 0.025 g of Na (Sigma-Aldrich) in the presence of 10 ml of dimethyl ether (Sigma-Aldrich) at 70° C. for 3 hours in a nitrogen atmosphere while refluxing. Then, the resultant was centrifuged, washed with dimethyl ether, and dried to obtain 0.04 g of $Na_2S_2$ in a light yellow solid powder form.

Preparation Example 3

Synthesis of $Na_2Te_2$ 0.13 g of Te (Sigma-Aldrich) was reacted with 0.025 g of $NaBH_4$ (Sigma-Aldrich) in the presence of 10 ml ethanol at 100° C. for 5 hours in a nitrogen atmosphere while refluxing. Then, the resultant was centrifuged, washed with ethanol, and dried to obtain 0.13 g of $Na_2Te_2$ in a black solid powder form.

Preparation Example 4

Synthesis of PbS Nanoparticles 0.237 g of Pb-acetate and 0.8 ml of oleic acid were dissolved in 8 ml of 1-octadecene, and the mixture was added to a flask. The flask was heated to 95° C., and 0.2 ml of bis(trimethylsilyl)sulfide and 1 ml of 1-octadecene were added to the flask. The flask was heated at 120° C. for 1 hour to obtain a dispersion of PbS nanoparticles (content of PbS: 10 wt %).

Example 1

Molar Ratio of PbS Nano Articles:$Na_2Se_2$=8:1

0.02 g of $Na_2Se_2$ prepared according to Preparation Example 1 was added to 1.9 ml of a dispersion of PbS nanoparticles prepared according to Preparation Example 4, and the mixture was maintained at 20° C. for 1 hour in a nitrogen atmosphere. As a result, sulfur (S) atoms disposed on the surfaces of the PbS nanoparticles were substituted with selenium (Se) atoms. Thus, nanoparticles including a PbS-core and a PbSe-shell were obtained.

Example 2

Molar Ratio of PbS Nano Articles:$Na_2Se_2$=4:1

0.04 g of $Na_2Se_2$ prepared according to Preparation Example 1 was added to 1.9 ml of a dispersion of PbS nanoparticles prepared according to Preparation Example 4, and the mixture was maintained at 20° C. for 1 hour in a nitrogen atmosphere. As a result, sulfur (S) atoms disposed on the surfaces of the PbS nanoparticles were substituted with selenium (Se) atoms. Thus, PbS/PbSe core-shell nanoparticles including a PbS-core and a PbSe-shell were obtained. As a result of inductively coupled plasma (ICP) analysis of the PbS/PbSe core-shell nanoparticles prepared in Example 2, an atomic ratio of S:Se was 9:1.

Example 3

Molar Ratio of PbS Nano Articles:$Na_2Se_2$=1:4

0.16 g of $Na_2Se_2$ prepared according to Preparation Example 1 was added to 1.9 ml of a dispersion of PbS nanoparticles prepared according to Preparation Example 4, and the mixture was maintained at 20° C. for 1 hour in a nitrogen atmosphere. As a result, sulfur (S) atoms disposed on the surfaces of the PbS nanoparticles were substituted with selenium (Se) atoms. Thus, nanoparticles including a PbS-core and a PbSe-shell were prepared.

Figure 2A:
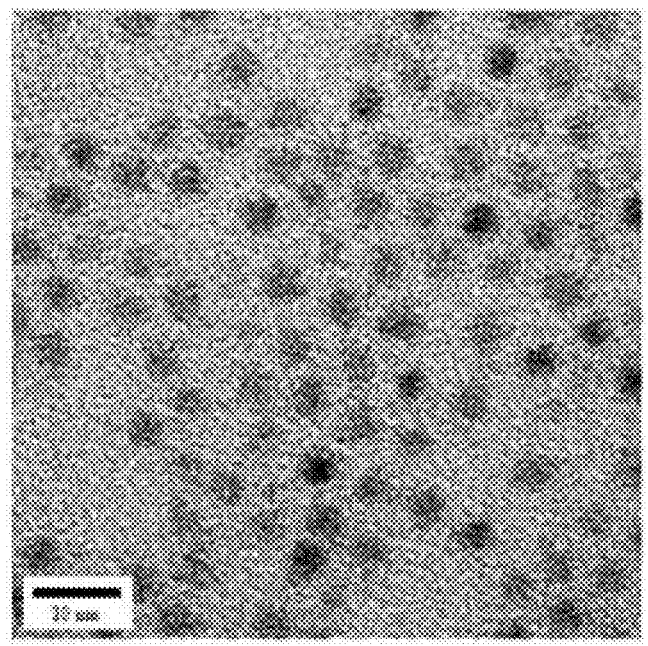
FIGS. 2A and 2B illustrate transmission electron microscopic (TEM) images of PbS nanoparticles according to Preparation Example 4 in which no anion exchange has occurred and PbS/PbSe core-shell nanoparticles, respectively, according to Example 2.
Figure 2B:
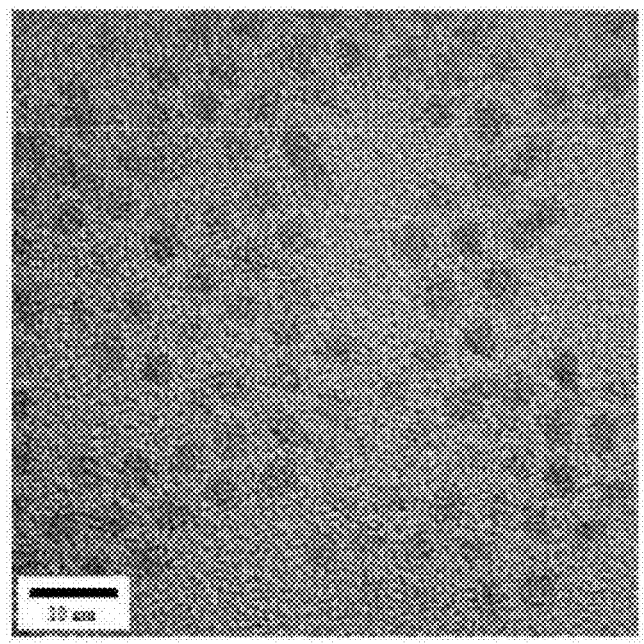

FIG. 2A illustrates transmission electron microscopic (TEM) images of the PbS nanoparticles according to Preparation Example 4 in which no anion exchange has occurred and FIG. 2B illustrates transmission electron microscopic (TEM) images of PbS/PbSe core-shell nanoparticles, according to Example 2. As illustrated in FIG. 2A and 2B, the sizes of the nanoparticles were substantially unchanged before and after anion exchange.

Figure 3:
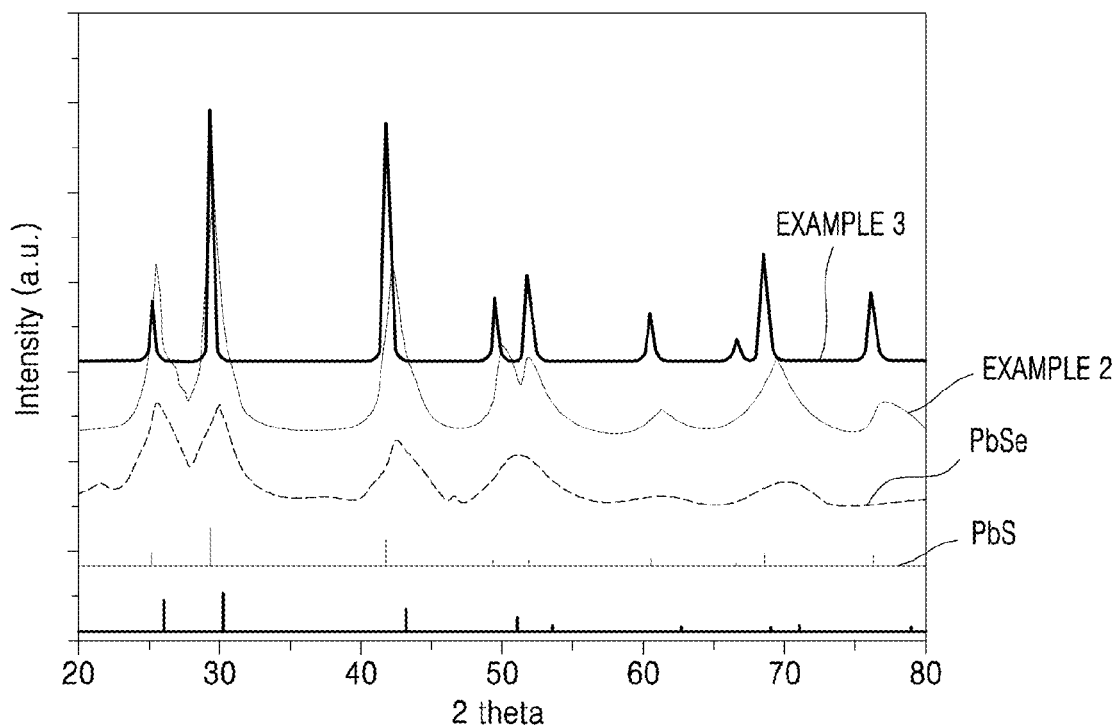
FIG. 3 is a graph illustrating X-ray diffraction (XRD) test results of PbS nanoparticles according to Preparation Example 4 in which no anion exchange has occurred, PbS/PbSe core-shell nanoparticles according to Example 2, and PbS/PbSe core-shell nanoparticles according to Example 3.

FIG. 3 is a graph illustrating XRD analysis results of PbS nanoparticles according to Preparation Example 4 in which no anion exchange has occurred, PbS/PbSe core-shell nanoparticles according to Example 2, and PbS/PbSe core-shell nanoparticles according to Example 3. FIG. 3 also illustrates XRD analysis results of PbSe particles. Referring to FIG. 3, as the amount of anion exchange increases, the position of an XRD peak is changed from a PbS-type shape to a PbSe-type shape. Referring to the XRD analysis results of FIG. 3, Se exhibited a stronger peak than S, since sensitivity of the XRD analysis to Se is greater than that of the XRD analysis to S.

Figure 4:
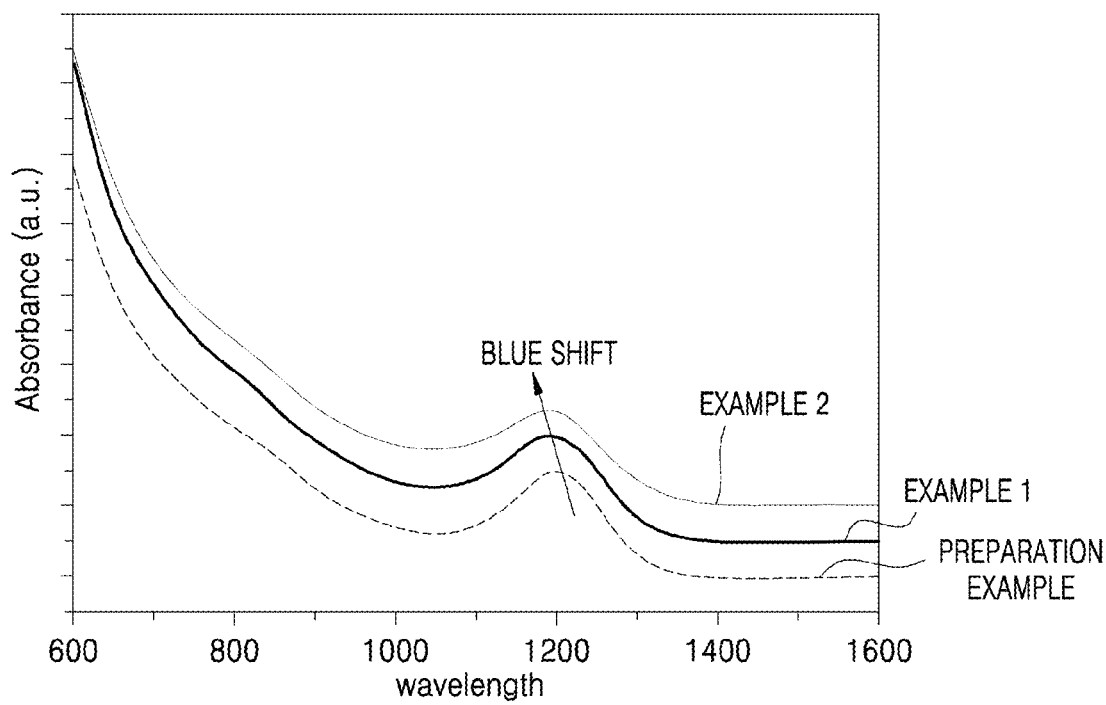
FIG. 4 is a graph illustrating analysis results of UV-VIS absorbance of PbS nanoparticles according to Preparation Example 4 in which no anion exchange has occurred, PbS/PbSe core-shell nanoparticles according to Example 1, and PbS/PbSe core-shell nanoparticles according to Example 2.

FIG. 4 is a graph illustrating analysis results of UV-VIS absorbance of PbS nanoparticles according to Preparation Example 4 in which no anion exchange has occurred, PbS/PbSe core-shell nanoparticles according to Example 1, and PbS/PbSe core-shell nanoparticles according to Example 2. As the amount of anion exchange increases, the size of the PbS-core decreases, and thus, the absorption peak is blue-shifted. If an alloy of PbSeS had been formed or the thickness of the Se-shell had increased, the absorption peak would have been red-shifted.

As described above, according to the one or more of the above exemplary embodiments, an elemental component of a nanoparticle or an elemental component of a passivation layer of a surface of a nanoparticle may be changed via anion exchange reactions. In addition, according to one or more of the above exemplary embodiments, the amount of the elemental component of the nanoparticle or the amount of the elemental component of the passivation layer of a surface of a nanoparticle may be controlled via anion exchange reactions. Thus, anion exchange reactions may be used to efficiently design structures and compositions of materials. In particular, anion exchange reactions may be used to efficiently design structures and compositions of nanoparticles. Accordingly, the characteristics of the nanoparticles may be efficiently controlled.

It should be understood that the exemplary embodiments described herein should be considered as being descriptive only, and do not serve to limit the present disclosure. Descriptions of features or aspects within each exemplary embodiment should typically be considered as being available for other similar features or aspects in other exemplary embodiments.

While one or more exemplary embodiments have been described with reference to the figures, it will be understood by those of ordinary skill in the art that various changes in form and details may be made therein without departing from the spirit and scope of the inventive concept as defined by the following claims.

What is claimed is:

1. An anion exchange method comprising:
exchanging an anionic element of a nanoparticle with an element X of an anion exchange precursor represented by $Na_2X_n$ via a reaction between the anion exchange precursor and the nanoparticle in the presence of a reaction medium, wherein X is at least one element selected from the group consisting of Se, S, and Te, and n is an integer from 2 to 10,
wherein the nanoparticle is CdS, CdSe, CdTe, ZnS, ZnSe, ZnTe, ZnO, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, CdHgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe, SiC, or a combination thereof; or comprises the anionic element and Si, Ge, or SiGe.

2. The anion exchange method of claim 1, wherein an anion exchange reaction occurs on the surface of the nanoparticle, or occurs on the surface of and inside of the nanoparticle.

3. The anion exchange method of claim 1, wherein n is an integer of 2 to 5.

4. The anion exchange method of claim 1, wherein the nanoparticle is a quantum dot, a metal nanocrystal (NC) comprising the anionic element, a magnetic nanocrystal, an oxide nanocrystal, a nanowire, or a nanoplate.

5. The anion exchange method of claim 1, wherein the nanoparticle is present in an amount of from about 100 parts by weight to about 10,000,000 parts by weight based on 100 parts by weight of the anion exchange precursor.

6. The anion exchange method of claim 1, wherein the reaction medium comprises at least one polar solvent.

7. The anion exchange method of claim 6, wherein the polar solvent comprises water, dimethylformamide (DMF), dimethylsulfoxide (DMSO), ethanolamine, formamide, hydrazine hydrate, acetonitrile, or a combination thereof.

8. The anion exchange method of claim 1, wherein the reaction medium is present in an amount of from about 10,000 parts by weight to about 10,000,000,000 parts by weight based on 100 parts by weight of the anion exchange precursor.

9. A method of preparing a nanoparticle, the method comprising:
preparing a second nanoparticle by exchanging an anionic element of a first nanoparticle with an element X of an anion exchange precursor represented by $Na_2X_n$ via a reaction between the anion exchange precursor and the first nanoparticle in the presence of a reaction medium, wherein X is at least one element selected from the group consisting of Se, S, and Te, and n is an integer from 2 to 10,
wherein the nanoparticle is CdS, CdSe, CdTe, ZnS, ZnSe, ZnTe, ZnO, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, CdHgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe, SiC, or a combination thereof; or comprises the anionic element and Si, Ge, or SiGe.

* * * * *